US012560721B2

(12) United States Patent (10) Patent No.: US 12,560,721 B2
McGuire (45) Date of Patent: Feb. 24, 2026

(54) SPAD LIDAR SYSTEM WITH BINNED PIXELS

(71) Applicant: GM Cruise Holdings LLC, San Francisco, CA (US)

(72) Inventor: Shane McGuire, Redwood City, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 1096 days.

(21) Appl. No.: 17/486,857

(22) Filed: Sep. 27, 2021

(65) Prior Publication Data

US 2023/0108592 A1 Apr. 6, 2023

(51) Int. Cl.
 *G01S 17/93* (2020.01)
 *G01S 7/481* (2006.01)
 *G01S 17/931* (2020.01)
 *H10F 30/225* (2025.01)
 *G01S 7/48* (2006.01)

(52) U.S. Cl.
 CPC .......... *G01S 17/931* (2020.01); *G01S 7/4815* (2013.01); *H10F 30/225* (2025.01); *G01S 7/4808* (2013.01)

(58) Field of Classification Search
 None
 See application file for complete search history.

(56) References Cited

U.S. PATENT DOCUMENTS

| | | | |
|---|---|---|---|
| 2015/0049168 A1* | 2/2015 | Dielacher | H04N 7/18 |
| | | | 348/169 |
| 2017/0176579 A1* | 6/2017 | Niclass | G01S 17/10 |
| 2018/0081041 A1* | 3/2018 | Niclass | G01S 17/894 |

* cited by examiner

*Primary Examiner* — Hovhannes Baghdasaryan
(74) *Attorney, Agent, or Firm* — Honigman LLP; Matthew H. Szalach; Jonathan P. O'Brien

(57) ABSTRACT

Various technologies described herein pertain to a SPAD lidar system that includes a transmitter and a receiver. The transmitter is configured to transmit a transmitted electromagnetic signal into an environment nearby the SPAD lidar system, and the receiver is configured to receive a received electromagnetic signal from the environment nearby the SPAD lidar system. The receiver includes a SPAD sensor array (which includes SPAD pixels) and a binning system. The received electromagnetic signal is inputted to the SPAD pixels of the SPAD sensor array. The binning system is configured to combine outputs of groups of the SPAD pixels to generate combined outputs for the groups and assign the combined outputs to SPAD pixels in the groups, where the groups are overlapping. A processing system of the SPAD lidar system can generate lidar data based on the combined outputs.

20 Claims, 9 Drawing Sheets

400

500                                           502

EDGE SPAD PIXEL

PADDING PIXEL

1000

START

RECEIVE OUTPUTS OF SPAD PIXELS OF A SPAD SENSOR ARRAY OF A SPAD LIDAR SYSTEM — 1002

COMBINE THE OUTPUTS OF GROUPS OF THE SPAD PIXELS TO GENERATE COMBINED OUTPUTS FOR THE GROUPS — 1004

ASSIGN THE COMBINED OUTPUTS TO RESPECTIVE SPAD PIXELS FROM THE GROUPS — 1006

GENERATE LIDAR DATA BASED ON THE COMBINED OUTPUTS ASSIGNED TO THE SPAD PIXELS — 1008

END

SPAD LIDAR SYSTEM WITH BINNED PIXELS

BACKGROUND

An autonomous vehicle is a motorized vehicle that can operate without human conduction. An exemplary autonomous vehicle includes a plurality of sensor systems, such as but not limited to, a lidar sensor system, a camera sensor system, and a radar sensor system, amongst others. The autonomous vehicle operates based upon sensor signals output by the sensor systems.

Recently, various sensor systems of autonomous vehicles have started to include single-photon avalanche diode (SPAD) sensor arrays. For instance, some lidar sensor systems include SPAD sensor arrays. The SPAD sensor array of such a lidar sensor system can be utilized for time-of-flight measurements. Thus, the SPAD sensor array can enable generating three-dimensional depth measurements to object(s) in an environment nearby the lidar sensor system. By including a SPAD sensor array as part of a lidar sensor system, the lidar sensor system need not include moving parts (e.g., mechanical scanners). Thus, a lidar sensor system that includes a SPAD sensor array can be a solid state sensor without moving parts; accordingly, costs and reliability issues commonly associated with the moving parts of conventional lidar sensor systems can be mitigated through use of SPAD sensor arrays.

Use of a SPAD sensor array without a physical mechanism for scanning can result in an angular resolution of a lidar sensor system being based on a resolution of the SPAD sensor array itself. For instance, a number of SPAD pixels included as part of the SPAD sensor array can determine the angular resolution of the lidar sensor system that includes the SPAD sensor array. Moreover, as a size of the SPAD pixels of the SPAD sensor array decreases, a range of the lidar sensor system that includes the SPAD sensor array can be detrimentally impacted. For instance, a decrease in the size of a SPAD pixel can result in fewer photons being collected by the SPAD pixel (e.g., which leads to a decrease in range). Accordingly, there is a tradeoff between angular resolution and range (e.g., increasing SPAD pixel size leads to increased range and decreased angular resolution, decreasing SPAD pixel size leads to decreased range and increased angular resolution). Further, increasing a number of SPAD pixels included as part of the SPAD sensor array (assuming no change in the size of the SPAD pixels) can increase a physical size of the SPAD sensor array; as the overall size of the SPAD sensor array is increased, optics utilized in front of the SPAD sensor array can increase in size and a silicon die area for the SPAD sensor array can increase, both of which lead to increased costs.

SUMMARY

The following is a brief summary of subject matter that is described in greater detail herein. This summary is not intended to be limiting as to the scope of the claims.

Described herein are various technologies that pertain to a single-photon avalanche diode (SPAD) lidar system. In accordance with various embodiments, an autonomous vehicle can include the SPAD lidar system. The SPAD lidar system includes a transmitter and a receiver. The transmitter can be configured to transmit a transmitted electromagnetic signal into an environment nearby the SPAD lidar system. Moreover, the receiver can be configured to receive a received electromagnetic signal from the environment nearby the SPAD lidar system. A portion of the received electromagnetic signal can correspond to the transmitted electromagnetic signal. For instance, a portion of the transmitted electromagnetic signal can be reflected by an object (or objects) nearby the SPAD lidar system and return to the receiver of the SPAD lidar system (as the portion of the received electromagnetic signal). Moreover, the receiver of the SPAD lidar system can include a SPAD sensor array and a binning system. The SPAD sensor array includes SPAD pixels. The received electromagnetic signal can be inputted to the SPAD pixels of the SPAD sensor array. Further, the binning system can be configured to combine outputs of groups of the SPAD pixels to generate combined outputs for the groups. The binning system can also be configured to assign the combined outputs to SPAD pixels in the groups. For instance, the binning system can be configured to combine outputs of a first group of the SPAD pixels to generate a first combined output for the first group and assign the first combined output to one of the SPAD pixels in the first group. Further, the binning system can be configured to combine outputs of a second group of the SPAD pixels to generate a second combined output for the second group and assign the second combined output to one of the SPAD pixels in the second group. The first group and the second group are overlapping such that a subset of the SPAD pixels are included in both the first group and the second group. Moreover, a processing system of the SPAD lidar system can generate lidar data based on the combined outputs assigned to the SPAD pixels.

Various sizes of groups of SPAD pixels are intended to fall within the scope of the hereto appended claims (e.g., the groups can each be 3 pixels by 3 pixels, 5 pixels by 5 pixels, etc.). According to various embodiments, it is contemplated that the size of the groups can be modified over time (e.g., based on an operating parameter of the autonomous vehicle). In other embodiments, the size of the groups can remain the same over time.

In accordance with various embodiments, the binning system can be configured to assign the combined outputs for the groups to respective center pixels of the groups. Moreover, the groups can be formed by the binning system in a manner that allows for assigning respective combined outputs to the SPAD pixels (e.g., each SPAD pixel can have a corresponding combined output assigned thereto, each SPAD pixel of the SPAD pixel array other than SPAD pixels along edges of the SPAD pixel array can have a corresponding combined output assigned thereto).

According to various embodiments, the binning system can combine digital outputs of the groups of the SPAD pixels. In accordance with such embodiments, the receiver of the SPAD lidar system can further include a readout system and an analog to digital converter (ADC). The readout system can be configured to readout analog outputs of the SPAD pixels in the SPAD sensor array. Further, the ADC can be configured to convert the analog outputs of the SPAD pixels to digital outputs of the SPAD pixels. Pursuant to such embodiments, the binning system can combine the digital outputs of the groups of the SPAD pixels.

Pursuant to other embodiments, the binning system can combine analog outputs of the SPAD pixels. For instance, the binning system can be a binning readout system configured to readout analog outputs of the SPAD pixels in the SPAD sensor array and combine the analog outputs of the groups of the SPAD pixels to generate combined analog outputs for the groups. The receiver of the SPAD lidar system can further include an ADC configured to convert the combined analog outputs to digital outputs.

In accordance with various embodiments, a method of operating a SPAD lidar system can include receiving outputs of SPAD pixels of a SPAD sensor array of the SPAD lidar system. The method can include combining the outputs of groups of the SPAD pixels to generate combined outputs for the groups. Further, the method can include assigning the combined outputs to respective SPAD pixels from the groups. Moreover, the method can include generating lidar data based on the combined outputs assigned to the SPAD pixels.

By employing the techniques set forth herein, the SPAD lidar system need not be limited by the tradeoff between angular resolution and range that is often encountered in conventional systems. In particular, outputs of a group of SPAD pixels can be combined to increase signal to noise ratio (SNR); the group of SPAD pixels can be binned to boost photon detection probability (PDP), which leads to increased range of operation of the SPAD lidar system. Moreover, by using overlapping groups of SPAD pixels, the angular resolution of the SPAD lidar system need not be decreased. Thus, binning the outputs of the SPAD pixels allows for increasing the range of the SPAD lidar system without decreasing the angular resolution or increasing an overall size of the SPAD pixel array.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
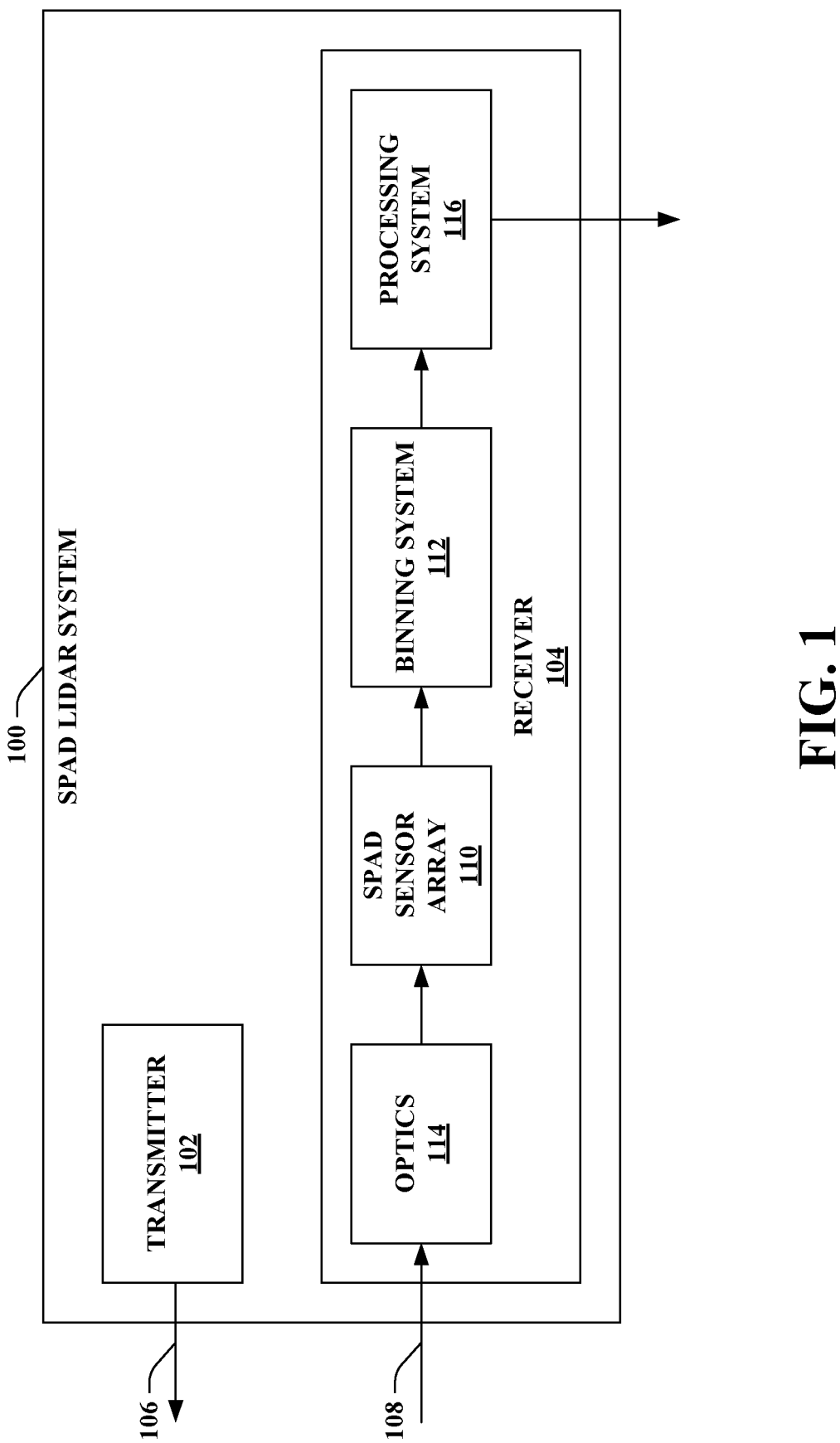
FIG. 1 illustrates a functional block diagram of an exemplary single-photon avalanche diode (SPAD) lidar system for an autonomous vehicle.

Various technologies pertaining to a SPAD lidar system that includes a SPAD sensor array having binned pixels are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Further, as used herein, the term "exemplary" is intended to mean "serving as an illustration or example of something."

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

Referring now to the drawings, FIG. 1 illustrates an exemplary single-photon avalanche diode (SPAD) lidar system 100 for an autonomous vehicle. The SPAD lidar system 100 can be a time-of-flight (TOF) lidar system. The SPAD lidar system 100 includes a transmitter 102 and a receiver 104. The transmitter 102 can be configured to transmit a transmitted electromagnetic signal 106 into an environment nearby the SPAD lidar system 100. Moreover, the receiver 104 can be configured to receive a received electromagnetic signal 108 from the environment nearby the SPAD lidar system 100. A portion of the received electromagnetic signal 108 received by the receiver 104 can correspond to the transmitted electromagnetic signal 106. For instance, at least a portion of the transmitted electromagnetic signal 106 transmitted by the transmitter 102 can reflect off of an object (or objects) in the environment and return to the SPAD lidar system 100 (as at least a portion of the received electromagnetic signal 108).

The transmitted electromagnetic signal 106 can include electromagnetic radiation having wavelengths in the infrared spectrum. The received electromagnetic signal 108 can also include electromagnetic radiation having wavelengths in the infrared spectrum. According to an example, the wavelengths in the infrared spectrum can be 700 nanometers to 1 millimeter. Pursuant to another example, the wavelengths in the infrared spectrum can be between 850 and 940 nanometers. The claimed subject matter, however, is not limited to foregoing examples.

Although not depicted, it is contemplated that the transmitter 102 can include various components. For instance, the transmitter 102 can include a laser, a modulator, a resonator, front and optics, and the like. According to various examples, the laser can be a semiconductor laser, a laser diode, or the like.

The receiver 104 can include a SPAD sensor array 110 and a binning system 112. The SPAD sensor array 110 includes SPAD pixels. The received electromagnetic signal 108 can be inputted to the SPAD pixels of the SPAD sensor array 110. Moreover, the binning system 112 can be configured to combine outputs of groups of the SPAD pixels to generate combined outputs for the groups. The binning system 112 can further assign the combined outputs to SPAD pixels in the groups.

According to an illustration, the binning system 112 can be configured to combine outputs of a first group of the SPAD pixels to generate a first combined output for the first group and assign the first combined output to one of the SPAD pixels in the first group. Moreover, the binning system 112 can be configured to combine outputs of a second group of the SPAD pixels to generate a second combined output for the second group and assign the second combined output to one of the SPAD pixels in the second group. Further, the first group and the second group are overlapping such that a subset of the SPAD pixels are included in both the first group and the second group.

The binning system 112 can also be configured to combine outputs of a third group of the SPAD pixels to generate a third combined output for the third group. The binning system 112 can assign the third combined output to one of the SPAD pixels in the third group. Moreover, the first group, the second group, and the third group are overlapping (e.g., at least one SPAD pixel is included in the first group, the second group, and the third group). Further, the binning system 112 can be configured to combine outputs of a fourth group of SPAD pixels to generate a fourth combined output for the fourth group. The binning system 112 can assign the fourth combined output to one of the SPAD pixels in the fourth group. At least the first group and the fourth group can be non-overlapping (e.g., no SPAD pixel is in both the first group and the fourth group). Pursuant to an example, the second group, the third group, and the fourth group can be overlapping. In accordance with another example, the third group and the fourth group can be overlapping (e.g., the second group and the fourth group can be non-overlapping). According to yet another example, the fourth group may be non-overlapping with any of the first group, the second group, or the third group.

Various sizes of SPAD pixels are intended to fall within the scope of the hereto appended claims. According to various examples, a size of the SPAD pixels in the SPAD sensor array 110 can be in the range of 5 microns to 75 microns. Pursuant to other examples, a size of the SPAD pixels in the SPAD sensor array 110 can be in the range of 40 microns to 60 microns. However, it is contemplated that the claimed subject matter is not limited to the size of the SPAD pixels in the SPAD sensory array 110 being in the above-noted exemplary ranges.

Moreover, the SPAD sensor array 110 can include substantially any number of SPAD pixels. According to an example, the SPAD sensor array 110 can include 256 SPAD pixels by 128 SPAD pixels. It is to be appreciated, however, that other resolutions of the SPAD sensor array 110 are intended to fall within the scope of the hereto appended claims.

The receiver 104 can further include optics 114. The optics 114 can be configured to receive the received electromagnetic signal 108 from the environment nearby the SPAD lidar system 100. The optics 114, for example, can include a lens assembly, waveguide(s), etc. The optics 114 can be configured to cause the received electromagnetic signal 108 to be inputted to the SPAD sensor array 110 (e.g., the received electromagnetic signal 108 can travel through waveguide(s) and/or free space to the SPAD sensor array 110). According to an illustration, the optics 114 can cause the received electromagnetic signal 108 to be incident upon the SPAD pixels of the SPAD sensor array 110.

Moreover, the receiver 104 of the SPAD lidar system 100 can include a processing system 116. The processing system 116 can be configured to generate lidar data based on the combined outputs generated by the binning system 112. While depicted as being separate from the binning system 112 in various examples set forth herein, in other embodiments it is contemplated that the binning system 112 can be part of the processing system 116. For instance, the processing system 116 can output lidar data in a format that can be sent over a network (e.g., ethernet). Pursuant to an illustration, the data outputted by the processing system 116 can be sent over a network to a computing system of an autonomous vehicle.

According to an example, the binning system 112 can use a demosaic algorithm to recover resolution in the SPAD sensor array 110. Conventional use of a SPAD sensor array for remote sensing (e.g., lidar) can be detrimentally impacted by ambient noise for long range detections. In contrast, in the SPAD lidar system 100, the binning system 112 can bin SPAD pixels to boost photon detection probability (PDP). Moreover, to mitigate decreasing resolution, the binning system 112 can use a demosaic type algorithm such that lost resolution may be recovered (e.g., by reading output individual SPAD pixel statistics from the SPAD sensor array 110).

Figure 2:
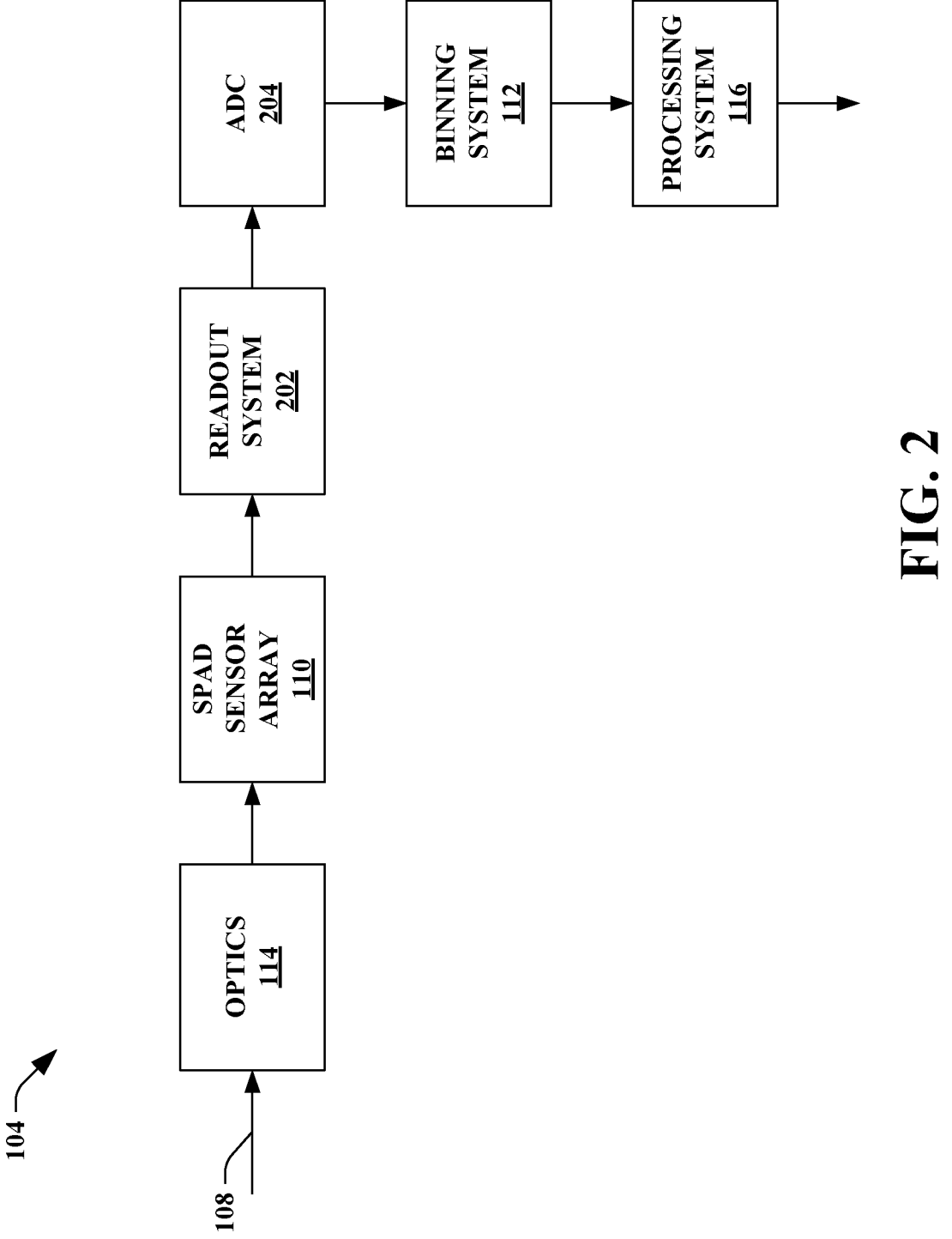
FIG. 2 illustrates a functional block diagram of an exemplary receiver of the SPAD lidar system where a binning system is implemented in digital logic.
Figure 3:
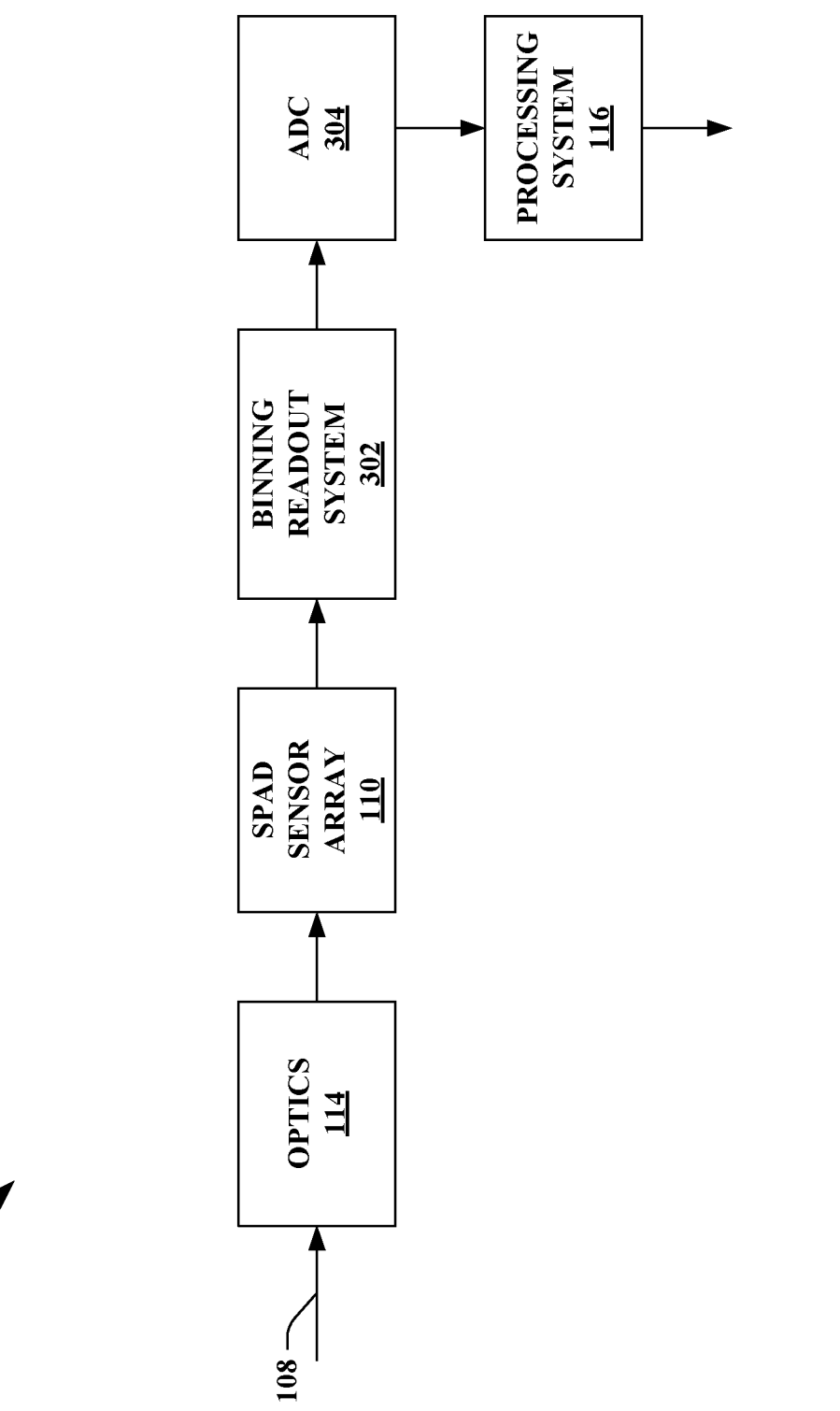
FIG. 3 illustrates a functional block diagram of another exemplary receiver of the SPAD lidar system where the binning system operates in the analog domain.

FIGS. 2-3 depict various exemplary implementations of the receiver 104 of the SPAD lidar system 100. In particular, FIG. 2 illustrates an example where the binning system 112 operates in the digital domain, whereas FIG. 3 illustrates an example where the binning system 112 operates in the analog domain.

Now turning to FIG. 2, illustrated is an example of the receiver 104 of the SPAD lidar system 100 where the binning system 112 is implemented in digital logic. As described above, the receiver 104 can include the optics 114, the SPAD sensor array 110, the binning system 112, and the processing system 116. Moreover, the receiver 104 of FIG. 2 can include a readout system 202 and an analog to digital converter (ADC) 204.

The optics 114 can receive the received electromagnetic signal 108 and cause the received electromagnetic signal 108 to be inputted to the SPAD sensor array 110. The readout system 202 can be configured to read out analog outputs of the SPAD pixels in the SPAD sensor array 110. Moreover, the ADC 204 can be configured to convert the analog outputs of the SPAD pixels to digital outputs of the SPAD pixels. A digital output for a particular SPAD pixel can be a histogram, for example. In the example set forth in FIG. 2, the binning system 112 can combine the digital outputs of groups of the SPAD pixels to generate combined outputs for the groups. For instance, the binning system 112 can perform a two-dimensional convolution to combine the digital outputs of SPAD pixels in a group to interpolate a likely value (e.g., the combined output) for one of the SPAD pixels in the group (e.g., a center pixel in the group); thus, this likely value can be assigned to such SPAD pixel in the group (e.g., the center pixel in the group). The binning system 112 can form groups throughout the SPAD sensor array 110 to enable recovering the full native resolution of the SPAD sensor array 110. Further, the processing system 116 can generate lidar data based on the combined outputs assigned to the SPAD pixels throughout the SPAD sensor array 110.

With reference to FIG. 3, illustrated is another exemplary embodiment of the receiver 104 of the SPAD lidar system 100. Again, the receiver 104 can include the optics 114, the SPAD sensor array 110, and the processing system 116. In the example set forth in FIG. 3, the binning system 112 is a binning readout system 302. Moreover, as depicted in FIG. 3, the receiver 104 includes an ADC 304.

The binning readout system 302 of FIG. 3 is configured to read out analog outputs of the SPAD pixels in the SPAD sensor array 110 and combine the analog outputs of the groups of the SPAD pixels to generate combined analog outputs for the groups. Moreover, the ADC 304 can be configured to convert the combined analog outputs to digital outputs, which can be inputted to the processing system 116 to generate the lidar data. The binning readout system 302 can combine the analog outputs of the groups while enabling reading out the full native resolution of the SPAD sensor array 110.

Figure 4:
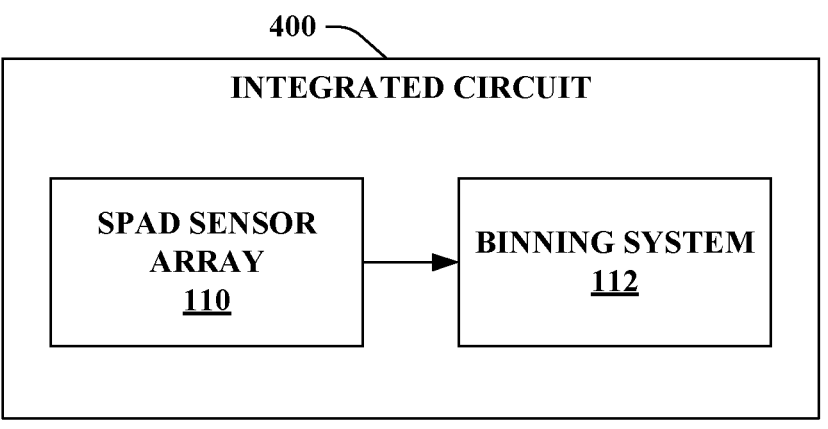
FIG. 4 illustrates a functional block diagram of an exemplary binning system included as part of an imager.

Now turning to FIG. 4, illustrated is an example where the binning system 112 is included as part of an imager. As depicted in FIG. 4, an integrated circuit 400 includes the SPAD sensor array 110 and the binning system 112. Thus, the SPAD sensor array 110 and the binning system 112 can be on the same integrated circuit 400. According to an example, the receiver 104 of FIG. 2 can include the integrated circuit 400 that includes the SPAD sensor array 110 and the binning system 112. Following this example, the integrated circuit 400 can also include other components, such as the readout system 202 and the ADC 204. In accordance with this example, the processing system 116 can be off chip and/or included as part of the integrated circuit 400. Pursuant to another example, the receiver 104 of FIG. 3 can include the integrated circuit 400; thus, the binning system 112 can be the binning readout system 302 and the integrated circuit 400 can further include the ADC 304 (though it is also contemplated that the ADC 304 can be off chip).

Figure 5:
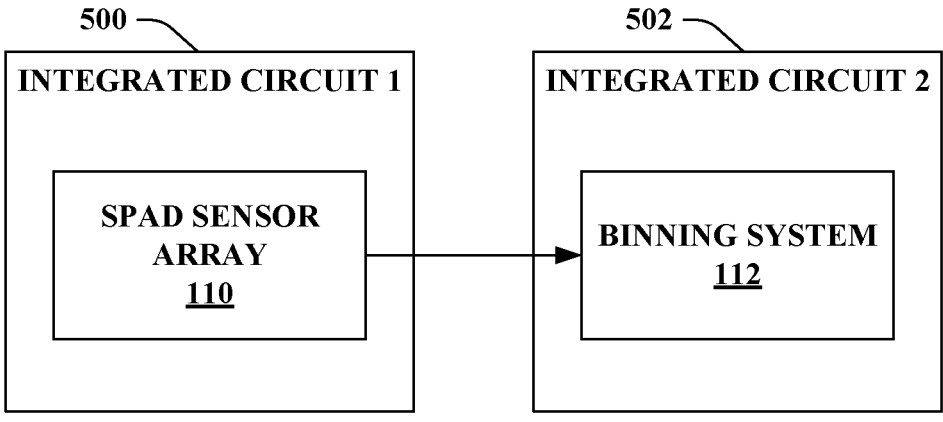
FIG. 5 illustrates a functional block diagram of an exemplary binning system that is off chip relative to an imager.

Referring now to FIG. 5, illustrated is an example where the binning system 112 is off chip relative to the imager. As shown in FIG. 5, a first integrated circuit 500 includes the SPAD sensor array 110 and a second integrated circuit 502 includes the binning system 112. The first integrated circuit 500 can further include the readout system 202 and the ADC 204; output from the ADC 204 can be provided to the second integrated circuit 502. The second integrated circuit 502, for instance, can further include the processing system 116. According to an illustration, the second integrated circuit 502 can include a graphics processing unit (GPU), a central processing unit (CPU), an application-specific integrated circuit (ASIC), a digital signal processor (DSP), a micro-controller, a programmable logic controller (PLC), a field programmable gate array (FPGA), or the like. It is contemplated that the binning system 112 can be part of the processing system 116 in various embodiments.

Figure 6:
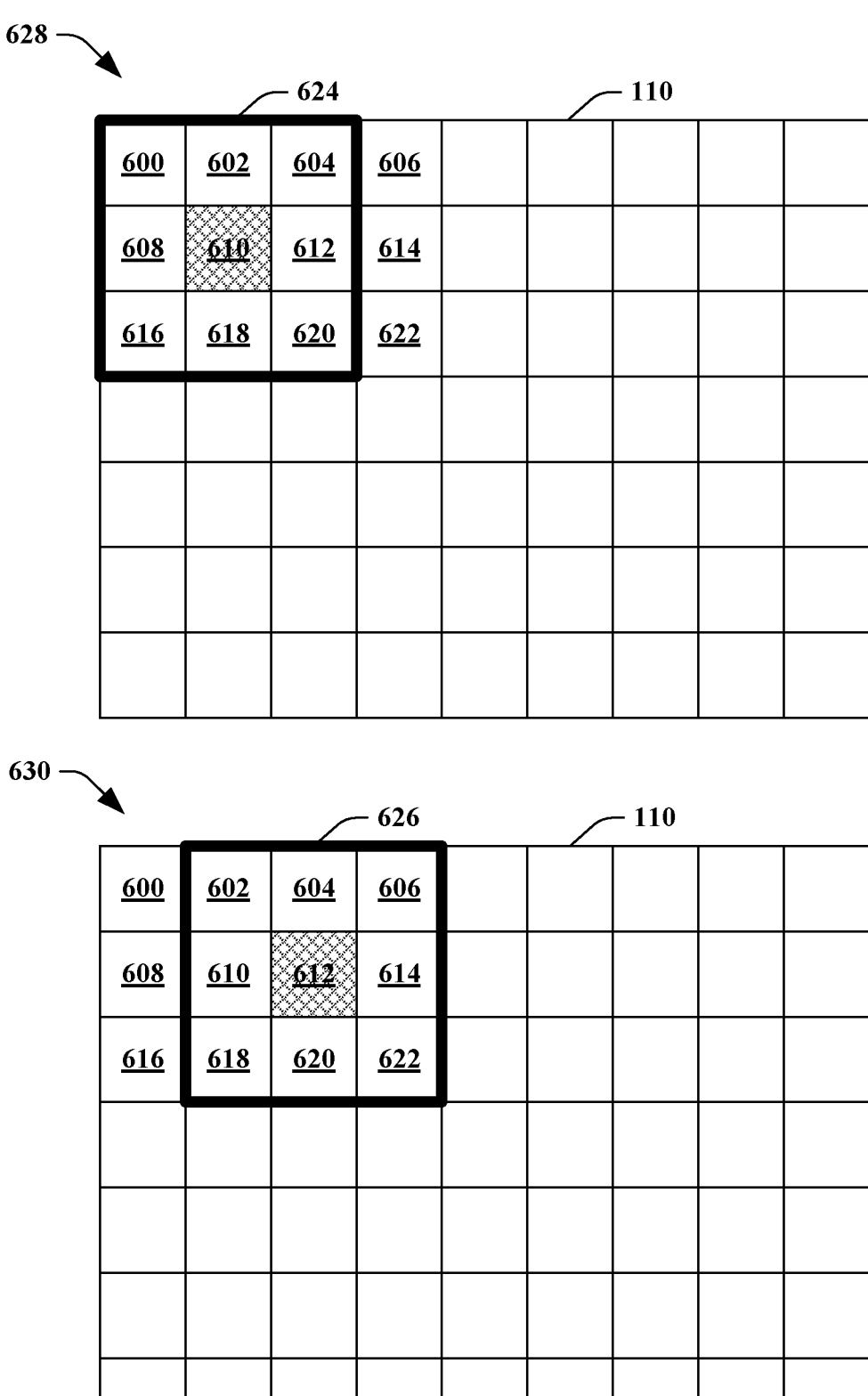
FIG. 6 illustrates an example of processing binned pixels that can be performed by the binning system.

Turning to FIG. 6, illustrated is an example of processing binned pixels that can be performed by the binning system 112. In the example shown in FIG. 6, the SPAD sensor array

110 is depicted as including nine pixels by seven pixels (including SPAD pixels 600-622). However, it is contemplated that the SPAD sensor array 110 shown in FIG. 6 is provided merely for illustration purposes, and the claimed subject matter is not limited to the SPAD sensor array 110 including such number of pixels.

Two groups of SPAD pixels are shown in FIG. 6 for purposes of illustration, namely, a group 624 and a group 626. The groups 624 and 626 shown in FIG. 6 are each 3 pixels by 3 pixels; however, it is contemplated that other sizes of groups of SPAD pixels are intended to fall within the scope of the hereto appended claims (e.g., a size of a group can include odd numbers of rows and columns so that there is a center pixel, 5 pixels by 5 pixels, 9 pixels by 9 pixels, etc.). While the shape of many of the groups of SPAD pixels described herein is a square, it is contemplated that other shapes are intended to fall within the scope of the hereto appended claims (e.g., a non-square rectangle, a plus sign, etc.) It is to be appreciated that additional groups in addition to the groups 624 and 626 are similarly formed across the SPAD sensor array 110 to enable recovering the full native resolution of the SPAD sensor array 110.

As shown at 628, the group 624 includes the following 9 SPAD pixels of the SPAD pixel array 110: the SPAD pixels 600, 602, 604, 608, 610, 612, 616, 618, and 620. The binning system 112 can combine outputs for the group 624 of SPAD pixels to generate a first combined output for the group 624. Moreover, the binning system 112 can assign the first combined output to one of the SPAD pixels in the group 624. For example, the binning system 112 can assign the first combined output to a center pixel in the group 624, namely, the SPAD pixel 610.

Further, as shown at 630, the group 626 includes the following 9 SPAD pixels of the SPAD pixel array 110: the SPAD pixels 602, 604, 606, 610, 612, 614, 618, 620, and 622. The binning system 112 can combine outputs for the group 626 of SPAD pixels to generate a second combined output for the group 626. Moreover, the binning system 112 can assign the second combined output to one of the SPAD pixels in the group 626. For example, the binning system 112 can assign the second combined output to a center pixel in the group 626, namely, the SPAD pixel 612.

As illustrated in FIG. 6, the groups 624 and 626 are overlapping. Thus, a subset of the SPAD pixels of the SPAD pixel array 100 are included in both of the groups 624 and 626. In particular, the following SPAD pixels are included in both of the groups 624 and 626: the SPAD pixels 602, 604, 610, 612, 618, and 620. By shifting the group 626 horizontally one pixel relative to the group 624, combined outputs can be assigned by the binning system 112 to the SPAD pixel 610 and the SPAD pixel 612 (e.g., adjacent SPAD pixels within the SPAD pixel array 110). Such overlap of groups can be replicated across the SPAD sensor array 110 to enable each of the SPAD pixels of the SPAD pixel array 110 to have a corresponding combined output assigned thereto. However, in some embodiments, it is contemplated that SPAD pixels along edges of the SPAD pixel array 110 need not have corresponding combined outputs assigned thereto.

According to an illustration, analog outputs of the SPAD pixels of the SPAD pixel array 110 generated during a given time period are read out and converted to digital outputs of the SPAD pixels for the given time period. The binning system 112 can combine the digital outputs in the overlapping groups for the given time period (e.g., the first combined output assigned to the SPAD pixel 610 and the second combined output assigned to the SPAD pixel 612 are both generated from the digital outputs of the SPAD pixels for the given timer period).

While many of the examples set forth herein describe the binning system 112 assigning combined outputs to corresponding center pixels in groups, it is contemplated that the binning system 112 can alternatively assign the combined outputs to other pixels in the groups (e.g., the binning system 112 can assign the combined outputs to top left pixels in the groups, etc.).

Figure 7:
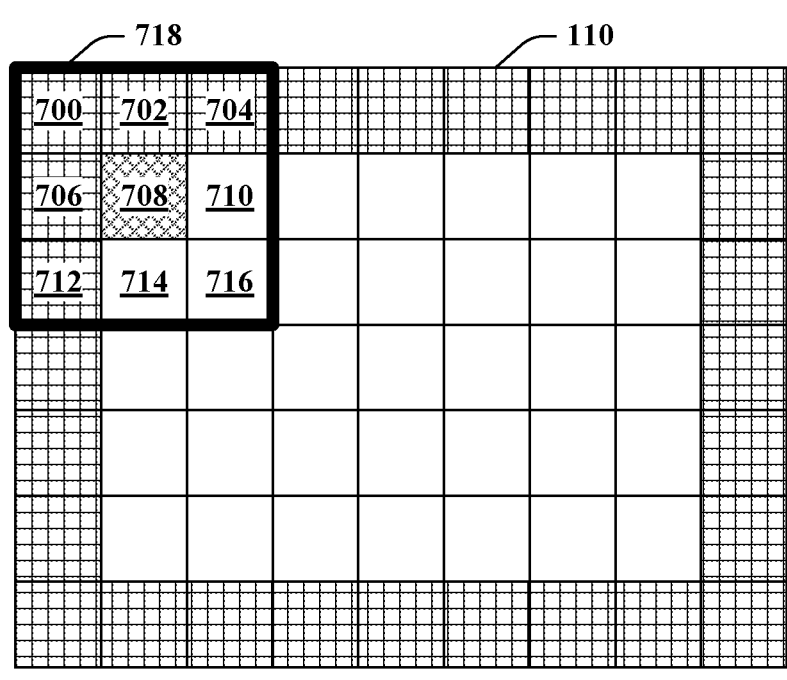
FIGS. 7-8 illustrate exemplary techniques for handling edge pixels of a SPAD sensor array.
Figure 8:
Figure 8:
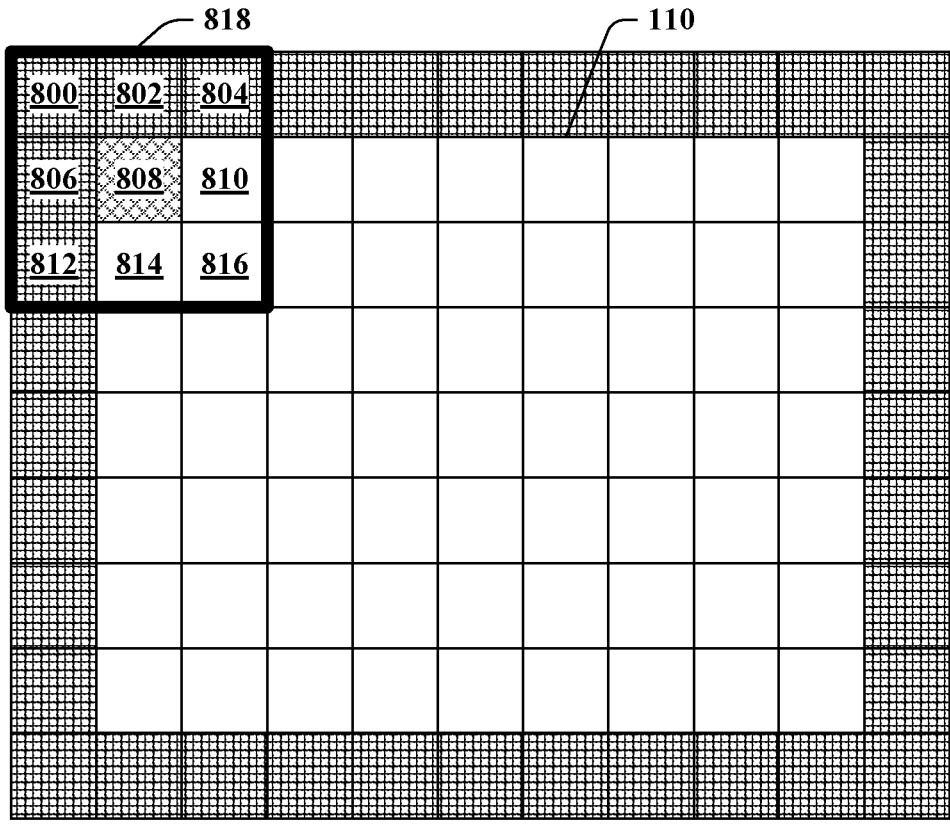

FIGS. 7-8 depict exemplary techniques for handling edge pixels of the SPAD sensor array 110. These examples show the exemplary SPAD sensor array 110 of FIG. 6 including nine pixels by seven pixels. Again, it is to be appreciated that the claimed subject matter is not limited to the SPAD sensor array 110 having the illustrated size, as substantially any number of SPAD pixels can be included in the SPAD sensor array 110.

In the example shown in FIG. 7, the binning system 112 need not assign combined outputs to edge SPAD pixels of the SPAD sensor array 110. The edge SPAD pixels of the SPAD sensor array 110 can be utilized for generating combined outputs to assign to non-edge SPAD pixels of the SPAD sensor array 110. As depicted, the SPAD pixel array 110 includes the SPAD pixels 700, 702, 704, 706, 708, 710, 712, 714, and 716 (as well as other SPAD pixels). The SPAD pixels 700-716 are included in a group 718 of SPAD pixels (e.g., the group 718 has a size of 3 pixels by 3 pixels); within the group 718, the SPAD pixels 700, 702, 704, 706, and 712 are edge SPAD pixels. Similar to above, the binning system 112 can combine outputs for the group 718 of SPAD pixels to generate a combined output for the group 718. Further, the binning system 112 can assign the combined output to a center pixel in the group 718, namely, the SPAD pixel 708. Accordingly, the edge SPAD pixels 700, 702, 704, 706, and 712 can be used for assigning the combined output to the SPAD pixel 708. However, corresponding combined outputs are not assigned to the edge SPAD pixels (including the edge SPAD pixels 700, 702, 704, 706, and 712 in the group 718) in the example set forth in FIG. 7. Instead, combined outputs are assigned to corresponding non-edge SPAD pixels of the SPAD sensor array 110.

Turning to FIG. 8, illustrated is an example where the binning system 112 pads edges of the SPAD sensor array 110 with additional padding pixels having an arbitrary value (e.g., zero). As shown, padding pixels surround edges of the SPAD pixel array 110. The padding pixels can be utilized for generating combined outputs to assign to the SPAD pixels of the SPAD sensor array 110. In the example of FIG. 8, a group 818 includes padding pixels 800, 802, 804, 806, and 812 as well as SPAD pixels 808, 810, 814, and 816 of the SPAD sensor array 110. The binning system 112 can combine outputs for the group 818 (including using the arbitrary values of the padding pixels 800, 802, 804, 806, and 812) to generate a combined output for the group 818. Further, the binning system 112 can assign the combined output to a center pixel in the group, namely, the SPAD pixel 808. In the example of FIG. 8, the SPAD pixel 808 can be an edge pixel of the SPAD sensor array 110. Thus, by padding the SPAD sensor array 110 as shown in the approach depicted in FIG. 8, corresponding outputs can be assigned to each of the SPAD pixels of the SPAD array 110 (including the edge SPAD pixels).

Figure 9:
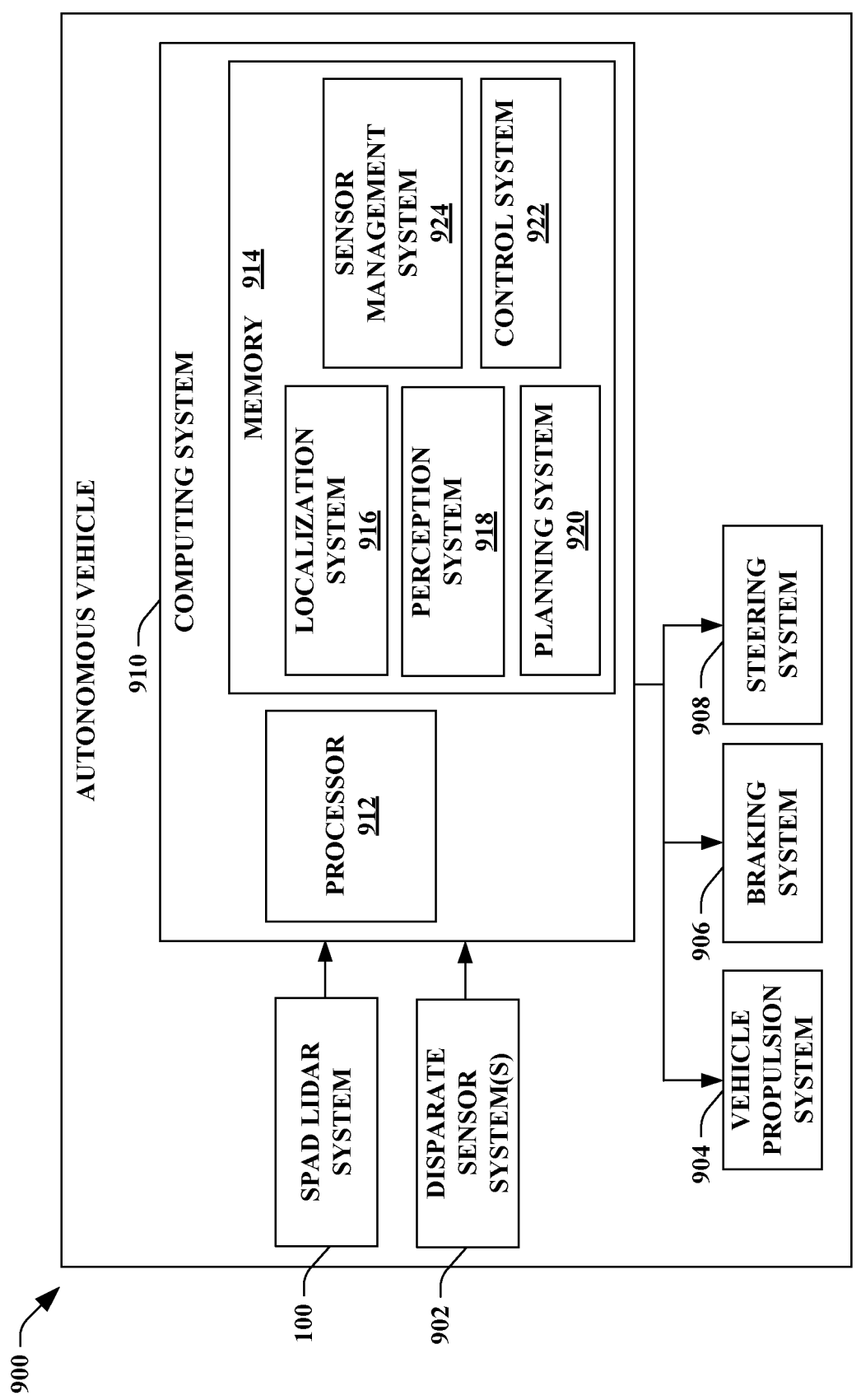
FIG. 9 illustrates a functional block diagram of an exemplary autonomous vehicle that includes the SPAD lidar system.

Turning to FIG. 9, illustrates an autonomous vehicle 900. The autonomous vehicle 900 can navigate about roadways without human conduction based upon sensor signals outputted by sensor systems of the autonomous vehicle 900.

The autonomous vehicle 900 includes a plurality of sensor systems. More particularly, the autonomous vehicle 900 includes the SPAD lidar system 100. The autonomous vehicle 900 can further include one or more disparate sensor systems 902. The disparate sensor systems 902 can include radar sensor systems, GPS sensor systems, ultrasonic sensor sensors, infrared sensor systems, a camera system, a lidar sensor system (separate from the SPAD lidar system 100), and the like. The sensor systems 100 and 902 can be arranged about the autonomous vehicle 900.

The autonomous vehicle 900 further includes several mechanical systems that are used to effectuate appropriate motion of the autonomous vehicle 900. For instance, the mechanical systems can include, but are not limited to, a vehicle propulsion system 904, a braking system 906, and a steering system 908. The vehicle propulsion system 904 may be an electric engine or a combustion engine. The braking system 906 can include an engine brake, brake pads, actuators, and/or any other suitable componentry that is configured to assist in decelerating the autonomous vehicle 900. The steering system 908 includes suitable componentry that is configured to control the direction of movement of the autonomous vehicle 900.

The autonomous vehicle 900 additionally includes a computing system 910 that is in communication with the sensor systems 100 and 902, the vehicle propulsion system 904, the braking system 906, and the steering system 908. The computing system 910 includes a processor 912 and memory 914; the memory 914 includes computer-executable instructions that are executed by the processor 912. Pursuant to various examples, the processor 912 can be or include a graphics processing unit (GPU), a plurality of GPUs, a central processing unit (CPU), a plurality of CPUs, an application-specific integrated circuit (ASIC), a digital signal processor (DSP), a microcontroller, a programmable logic controller (PLC), a field programmable gate array (FPGA), or the like.

The memory 914 of the computing system 910 can include a localization system 916, a perception system 918, a planning system 920, and a control system 922. The localization system 916 can be configured to determine a local position of the autonomous vehicle 900. The perception system 918 can be configured to perceive objects nearby the autonomous vehicle 900 (e.g., based on outputs from the sensor systems 100 and 902). For instance, the perception system 918 can detect, classify, and predict behaviors of objects nearby the autonomous vehicle 900. The perception system 918 (and/or differing system(s) included in the memory 914) can track the objects nearby the autonomous vehicle 900 and/or make predictions with respect to the environment in which the autonomous vehicle 900 is operating (e.g., predict the behaviors of the objects nearby the autonomous vehicle 900). Further, the planning system 922 can plan motion of the autonomous vehicle 900. Moreover, the control system 922 can be configured to control at least one of the mechanical systems of the autonomous vehicle 900 (e.g., at least one of the vehicle propulsion system 904, the braking system 906, and/or the steering system 908).

According to various embodiments, the memory 914 can further include a sensor management system 924. The sensor management system 924 can be configured to control operation of the SPAD lidar system 100. According to an example, the sensor management system 924 can set a number of pixels for the groups based on an operating parameter of the autonomous vehicle 900. Thus, the number of pixels to be included in the groups can be adjustable over time. For instance, during a first time period, the sensor management system 924 can cause the SPAD lidar system 100 to use groups having a size of 3 pixels by 3 pixels. Moreover, during a differing second time period, the sensor management system 924 can cause the SPAD lidar system 100 to use groups having a size of 9 pixels by 9 pixels. Examples of the operating parameter include a velocity of the autonomous vehicle 900, a maneuver being performed by the autonomous vehicle 900, a type of roadway upon which the autonomous vehicle 900 is traveling, or a combination thereof.

Figure 10:
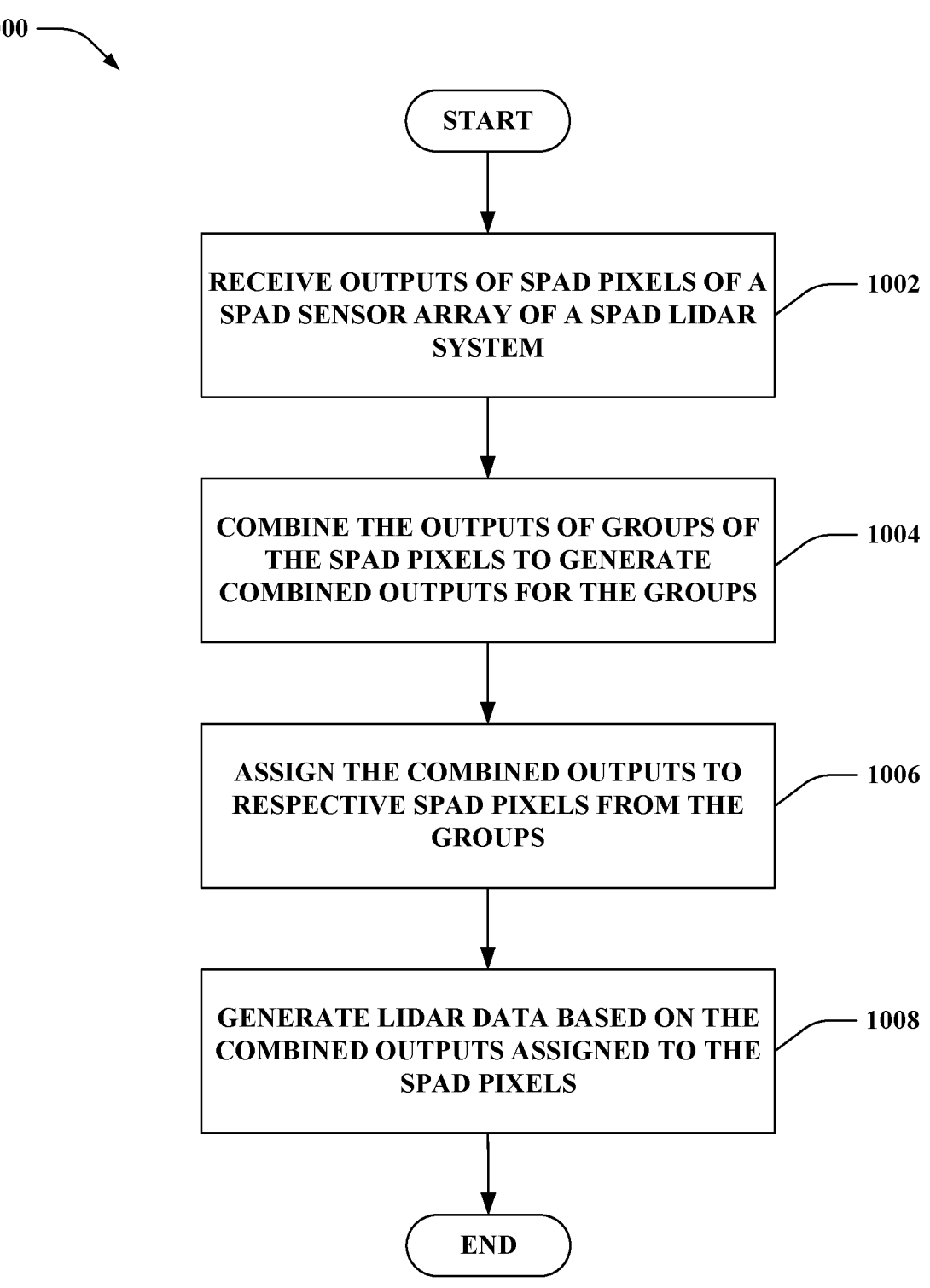
FIG. 10 illustrates an exemplary methodology of operating a SPAD lidar system.

FIG. 10 illustrates an exemplary methodology relating to operating a SPAD lidar system. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

FIG. 10 illustrates a methodology 1000 of operating a SPAD lidar system. At 1002, outputs of SPAD pixels of a SPAD sensor array of the SPAD lidar system can be received. According to an example, the outputs can be digital outputs of the SPAD pixels (e.g., analog outputs read out from the SPAD sensor array and converted to digital outputs). At 1004, the outputs of groups of the SPAD pixels can be combined to generate combined outputs for the groups. At 1006, the combined outputs can be assigned to respective SPAD pixels from the groups. Assigning the combined outputs to the respective SPAD pixels, for example, can include assigning a first combined output to a first SPAD pixel in a first group and assigning a second combined output to a second SPAD pixel in the second group. Following this example, the first group and the second group can be overlapping such that a subset of the SPAD pixels are included in both the first group and the second group. At 1008, lidar data can be generated based on the combined outputs assigned to the SPAD pixels.

Figure 11:
FIG. 11 illustrates an exemplary computing device.
Figure 11:
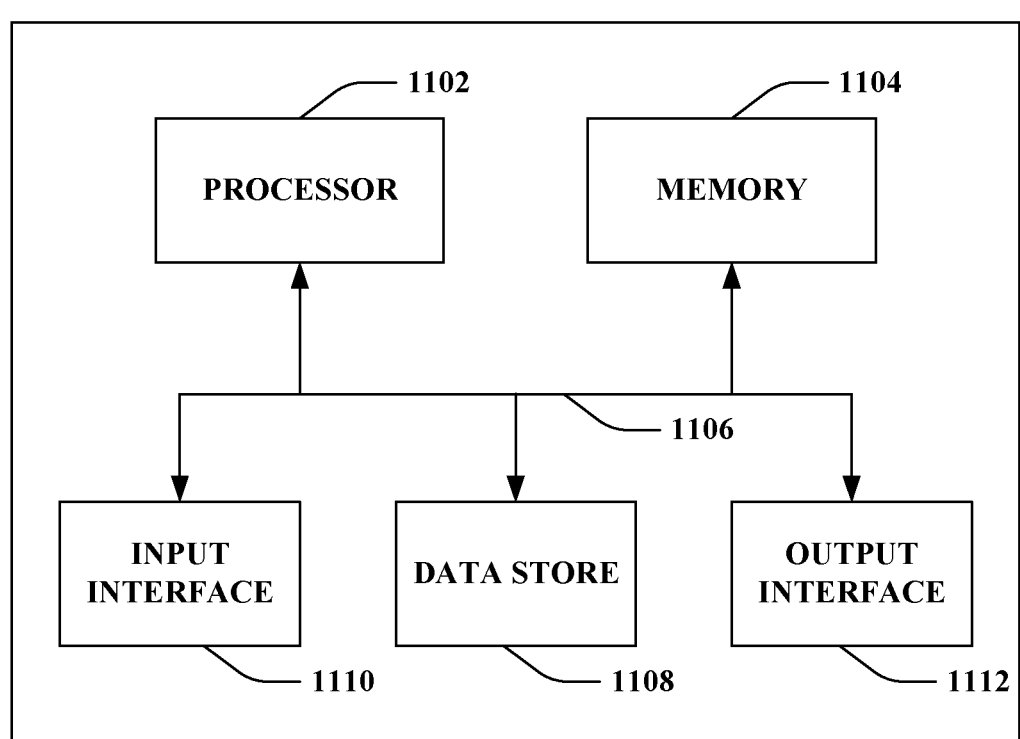

Referring now to FIG. 11, a high-level illustration of an exemplary computing device 1100 that can be used in accordance with the systems and methodologies disclosed herein is illustrated. For instance, the computing device 1100 may be or include the computing system 910. The computing device 1100 includes at least one processor 1102 that executes instructions that are stored in a memory 1104. The instructions may be, for instance, instructions for implementing functionality described as being carried out by one or more systems discussed above or instructions for implementing one or more of the methods described above. The processor 1102 may be a GPU, a plurality of GPUs, a CPU, a plurality of CPUs, a multi-core processor, etc. The processor 1102 may access the memory 1104 by way of a system bus 1106. In addition to storing executable instructions, the memory 1104 may also store various data.

The computing device 1100 additionally includes a data store 1108 that is accessible by the processor 1102 by way of the system bus 1106. The data store 1108 may include executable instructions, various data, etc. The computing device 1100 also includes an input interface 1110 that allows external devices to communicate with the computing device 1100. For instance, the input interface 1110 may be used to receive instructions from an external computer device, etc. The computing device 1100 also includes an output interface 1112 that interfaces the computing device 1100 with one or more external devices. For example, the computing device 1100 may transmit control signals to the vehicle propulsion system 904, the braking system 906, and/or the steering system 908 by way of the output interface 1112.

Additionally, while illustrated as a single system, it is to be understood that the computing device 1100 may be a distributed system. Thus, for instance, several devices may be in communication by way of a network connection and may collectively perform tasks described as being performed by the computing device 1100.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A single-photon avalanche diode (SPAD) lidar system, comprising:
   a transmitter configured to transmit a transmitted electromagnetic signal into an environment nearby the SPAD lidar system; and
   a receiver configured to receive a received electromagnetic signal from the environment nearby the SPAD lidar system, a portion of the received electromagnetic signal corresponding to the transmitted electromagnetic signal, the receiver comprising:
      a SPAD sensor array comprising SPAD pixels, wherein the received electromagnetic signal is inputted to the SPAD pixels of the SPAD sensor array; and
      a binning system configured to combine outputs of groups of the SPAD pixels to generate combined outputs for the groups such that the binning system is configured to:
         combine outputs of a first group of the SPAD pixels by performing a first two-dimensional convolution of digital outputs of the SPAD pixels in the first group to interpolate a first combined output for the first group, the first combined output representing an interpolated value for a first center SPAD pixel in the first group;
         assign the first combined output to the first center SPAD pixel in the first group;
         combine outputs of a second group of the SPAD pixels by performing a second two-dimensional convolution of digital outputs of the SPAD pixels in the second group to interpolate a second combined output for the second group, the second combined output representing an interpolated value for a second center SPAD pixel in the second group; and
         assign the second combined output to the second center SPAD pixel in the second group,
         wherein the first group and the second group are overlapping such that a subset of the SPAD pixels are included in both the first group and the second group, and wherein the binning system combines the outputs of the first group of the SPAD pixels and combines the outputs of the second group of the SPAD pixels to recover a full native resolution of the SPAD sensor array.

2. The SPAD lidar system of claim 1, wherein the binning system is further configured to:
   combine outputs of a third group of the SPAD pixels to generate a third combined output for the third group; and
   assign the third combined output to one of the SPAD pixels in the third group,
   wherein the first group, the second group, and the third group are overlapping.

3. The SPAD lidar system of claim 1, wherein each of the groups of the SPAD pixels are 3 pixels by 3 pixels in the SPAD sensor array.

4. The SPAD lidar system of claim 1, wherein each of the groups of the SPAD pixels are 5 pixels by 5 pixels in the SPAD sensor array.

5. The SPAD lidar system of claim 1, the receiver further comprising:
   a readout system configured to read out analog outputs of the SPAD pixels in the SPAD sensor array; and
   an analog to digital converter (ADC) configured to convert the analog outputs of the SPAD pixels to digital outputs of the SPAD pixels, wherein the binning system combines the digital outputs of the groups of the SPAD pixels.

6. The SPAD lidar system of claim 1, wherein the binning system is a binning readout system configured to read out analog outputs of the SPAD pixels in the SPAD sensor array and combine the analog outputs of the groups of the SPAD pixels to generate combined analog outputs for the groups, and wherein the receiver further comprises:
   an analog to digital converter (ADC) configured to convert the combined analog outputs to digital outputs.

7. The SPAD lidar system of claim 1, wherein the binning system is further configured to assign the combined outputs for the groups to respective center pixels of the groups.

8. The SPAD lidar system of claim 1, further comprising an integrated circuit, wherein the integrated circuit comprises the SPAD sensor array and the binning system.

9. The SPAD lidar system of claim 1, further comprising:
   a first integrated circuit, the first integrated circuit comprises the SPAD sensor array; and
   a second integrated circuit, the second integrated circuit comprises the binning system, the second integrated circuit being separate from the first integrated circuit.

10. The SPAD lidar system of claim 1, wherein each of the SPAD pixels has a corresponding one of the combined outputs assigned thereto.

11. The SPAD lidar system of claim 1, the receiver further comprising:
   optics configured to:
      receive the received electromagnetic signal from the environment nearby the SPAD lidar system; and
      cause the received electromagnetic signal to be inputted to the SPAD sensor array.

12. The SPAD lidar system of claim 1, the receiver further comprising:
   a processing system configured to generate lidar data based on the combined outputs.

13. The SPAD lidar system of claim 1, wherein an autonomous vehicle comprises the SPAD lidar system.

14. An autonomous vehicle, comprising:
   a single-photon avalanche diode (SPAD) lidar system, comprising:
      a transmitter configured to transmit a transmitted electromagnetic signal into an environment nearby the SPAD lidar system; and
      a receiver configured to receive a received electromagnetic signal from the environment nearby the SPAD lidar system, a portion of the received electromagnetic signal corresponding to the transmitted electromagnetic signal, the receiver comprising:
         a SPAD sensor array comprising SPAD pixels, wherein the received electromagnetic signal is inputted to the SPAD pixels of the SPAD sensor array; and
         a binning system configured to combine outputs of groups of the SPAD pixels to generate combined outputs for the groups such that the binning system is configured to:
            combine outputs of a first group of the SPAD pixels by performing a first two-dimensional convolution of digital outputs of the SPAD pixels in the first group to interpolate a first combined output for the first group, the first combined output representing an interpolated value for a first center SPAD pixel in the first group;
            assign the first combined output to the first center SPAD pixel in the first group;

combine outputs of a second group of the SPAD pixels by performing a second two-dimensional convolution of digital outputs of the SPAD pixels in the second group to interpolate a second combined output for the second group, the second combined output representing an interpolated value for a second center SPAD pixel in the second group; and assign the second combined output to the second center SPAD pixel in the second group, wherein the first group and the second group are overlapping such that a subset of the SPAD pixels are included in both the first group and the second group, and wherein the binning system combines the outputs of the first group of the SPAD pixels and combines the outputs of the second group of the SPAD pixels to recover a full native resolution of the SPAD sensor array.

15. The autonomous vehicle of claim 14, further comprising:

a computing system, comprising:

a processor; and memory that stores computer-executable instructions that, when executed by the processor, cause the processor to perform acts comprising:

setting a number of pixels for the groups based on an operating parameter of the autonomous vehicle, wherein the number of pixels is adjustable over time.

16. The autonomous vehicle of claim 15, wherein the operating parameter of the autonomous vehicle comprises at least one of a velocity of the autonomous vehicle, a maneuver being performed by the autonomous vehicle, or a type of roadway upon which the autonomous vehicle is traveling.

17. The autonomous vehicle of claim 14, wherein each of the groups of the SPAD pixels are 3 pixels by 3 pixels in the SPAD sensor array.

18. A method of operating a single-photon avalanche diode (SPAD) lidar system, comprising:

receiving outputs of SPAD pixels of a SPAD sensor array of the SPAD lidar system;

combining outputs of a first group of the SPAD pixels by performing a first two-dimensional convolution of digital outputs of the SPAD pixels in the first group to interpolate a first combined output for the first group, the first combined output representing an interpolated value for a first center SPAD pixel in the first group;

assigning the first combined output to the first center SPAD pixel in the first group;

combining outputs of a second group of the SPAD pixels by performing a second two-dimensional convolution of digital outputs of the SPAD pixels in the second group to interpolate a second combined output for the second group, the second combined output representing an interpolated value for a second center SPAD pixel in the second group;

assigning the second combined output to the second center SPAD pixel in the second group; and generating lidar data based on the first combined output and the second combined output assigned to the SPAD pixels.

19. The method of claim 18, wherein the outputs of the SPAD pixels are digital outputs of the SPAD pixels received from an analog to digital converter (ADC), and wherein the ADC converts analog outputs read out from the SPAD pixels to the digital outputs of the SPAD pixels.

20. The method of claim 18, wherein:

the first group and the second group are overlapping such that a subset of the SPAD pixels are included in both the first group and the second group.

* * * * *